United States Patent [19]
Das et al.

[11] Patent Number: 5,978,391
[45] Date of Patent: Nov. 2, 1999

[54] WAVELENGTH REFERENCE FOR EXCIMER LASER

[75] Inventors: Palash P. Das, Vista; Richard L. Sandstrom, Encinitas; Igor Fomenkov, San Diego, all of Calif.

[73] Assignee: Cymer, Inc., San Diego, Calif.

[21] Appl. No.: 08/896,384

[22] Filed: Jul. 18, 1997

[51] Int. Cl.⁶ .................................................. H01S 3/225
[52] U.S. Cl. .............................. 372/20; 372/32; 372/57; 250/339.13; 250/341.5
[58] Field of Search .............................. 372/5, 9, 20, 23, 372/32, 33, 57; 356/409, 416, 425; 250/339.01, 339.09, 339.13, 341.5, 343, 372, 373

[56] References Cited

U.S. PATENT DOCUMENTS

| | | | |
|---|---|---|---|
| 4,823,354 | 4/1989 | Znotins et al. | 372/57 |
| 5,015,099 | 5/1991 | Nagai et al. | 37/20 X |
| 5,025,445 | 6/1991 | Anderson et al. | 372/20 |
| 5,450,207 | 9/1995 | Fomenkov | 356/416 |
| 5,780,843 | 7/1998 | Cliche et al. | 372/32 X |
| 5,835,520 | 11/1998 | Das et al. | 372/57 |

*Primary Examiner*—John D. Lee
*Attorney, Agent, or Firm*—Brian D. Ogonowsky

[57] ABSTRACT

The preferred embodiment of the invention uses known atomic or molecular absorptions as absolute wavelength standards for calibrating wavelength measurement instruments used in tunable lasers. Examples of atomic and molecular absorptions are carbon and molecular oxygen that have absorptions including 193.0905 nm and 193.2728 nm, respectively, for use with a tunable Argon Fluoride excimer laser at approximately 193 nm. A wavelength measuring device (e.g., a wavemeter) is equipped with a gas cell containing the absorption gas. During a calibration procedure, the wavelength measured by the wavemeter is compared to the atomic or molecular absorption. The wavemeter's calibration constants are then adjusted accordingly to match the wavemeter's output to the atomic or molecular absorption wavelength. Such calibration procedures, therefore, calibrate the wavemeter to absolute standards and correct for any drift in the wavemeter that may occur between calibrations. Some gases, such as molecular oxygen, have multiple molecular absorptions within the tunable range of the laser. The use of multiple absorptions during calibration procedure enhances the precision of the procedure due to the proximity of an absorption line to the final wavelength of interest. After calibration, the laser is tuned to the final wavelength of interest using the calibrated wavemeter.

15 Claims, 3 Drawing Sheets

WAVELENGTH REFERENCE FOR EXCIMER LASER

FIELD OF THE INVENTION

This invention relates to lasers and, in particular, to a technique for accurately tuning an excimer laser to output light of a desired wavelength.

BACKGROUND

Various methods are well known for wavelength tuning of lasers. Typically the tuning takes place in a device referred to as a line narrowing package or line narrowing module. A typical technique used for line narrowing and tuning of excimer lasers is to provide a window at the back of the discharge cavity through which a portion of the laser beam passes into the line narrowing package. There, the portion of the beam is expanded and directed to a grating which reflects a narrow selected portion of the laser's broader spectrum back into the discharge chamber where it is amplified. The laser is typically tuned by changing the angle at which the beam illuminates the grating. This may be done by adjusting the position of the grating or providing a mirror adjustment in the beam path. The adjustment of the grating position or the mirror position may be made by a mechanism which we will refer to as a wavelength adjustment mechanism. For many applications it is important that the laser not only be finely tunable but also that the wavelength of the beam be at a precise absolute value, with a very small deviation, such as for example 193.3500 nm ±0.0001 nm. This requires very precise calibration.

U.S. Pat. No. 5,450,207, entitled "Method and Apparatus for Calibrating a Laser Wavelength Control Mechanism," by Igor Fomenkov, assigned to the present assignee and incorporated herein by reference, describes a method for calibrating a wavelength adjustment mechanism for an excimer laser. In the '207 patent, a small portion of the light emitted by a laser is passed through a cell containing FeNe vapor, used as an absorption gas. The light exiting this vapor is then detected by a photodetector, and the intensity of the detected light is then analyzed. The FeNe vapor absorbs a portion of the laser light at a wavelength of 248.3271 nm. The laser has a tunable range between 247.9 nm to 248.7 nm. By detecting a dip in the intensity of the laser light passing through the vapor as the laser is slewed through a range of wavelengths, it is then known that the laser is tuned to a wavelength of 248.3271 nm. Such a technique may be used to calibrate the laser wavelength measuring system (hereafter called wavemeter). The wavemeter, now calibrated, may then accurately measure the wavelength of laser light at other wavelengths. Another such wavemeter is described in U.S. Pat. No. 5,025,445, assigned to the present assignee and incorporated herein by reference. Another wavemeter is described in U.S. application Ser. No. 08/780,865 (now U.S. Pat. No. 5,867,314), filed on Jan. 9, 1997, entitled Laser Wavelength Control Circuit Having Automatic DC Offset and Gain Adjustment, by Stuart Anderson, Docket No. 96-0012-01, assigned to the present assignee and incorporated herein by reference.

If the laser is used in a stepper in a wafer fabrication system, the stepper optics and the fabrication process are optimized for a specific laser wavelength. Accordingly, it is important that the laser wavelength be adjusted accurately so that a maximum amount of the laser energy occurs at the desired wavelength.

The FeNe vapor contains one absorption line within the tunable range of the laser and thus can only be used for calibration at one wavelength.

Another vapor which may be used for measuring the wavelength of a tunable ArF laser is carbon, which has an absorption line at 193.0905 nm. This absorption line is then used to calibrate a wavemeter.

It would be desirable to employ a wavelength measuring system which does not require calibration at only one wavelength. This would allow the operator to select a calibration wavelength closest to the final operating wavelength of interest. This would increase the accuracy of the wavelength measurement.

SUMMARY

A laser wavelength calibration structure is described herein which uses a tunable excimer (ArF) laser system tuned to approximately 193 nm and an improved wavelength reference source. The wavelength reference source contains one or more atomic or molecular gases that have a plurality of known absorptions in the tuning range of the ArF laser. One such gas is oxygen. The tunable laser is precisely tuned to any one of the absorption lines of the gas after first coarsely determining the wavelength of the laser. A wavemeter is then calibrated by finely tuning the laser to an absorption line relatively close to the intended final wavelength. Calibrating the wavemeter to a wavelength closer to the final wavelength of interest leads to a more accurate wavemeter reading of the final wavelength of interest. In one embodiment, the wavemeter is calibrated using two absorption lines on both sides of the wavelength of interest.

In a preferred embodiment, to initially calibrate the wavelength detection circuitry, a small quantity of carbon within the laser excitation chamber itself is used as a reference absorption gas, and the 193.0905 nm absorption wavelength of carbon is then detected as the laser is slewed (or otherwise adjusted) through its tuning range. Since carbon has a distinctive easily identifiable absorption line, the wavelength of the laser is precisely known in the immediate vicinity of the carbon line. Characteristic absorption lines in the oxygen (or other gas) closer to the desired operating wavelength of the laser are then used to further calibrate the system.

DETAILED DESCRIPTION OF THE PREFERRED EMBODIMENTS

First Preferred Embodiment

Figure 1:
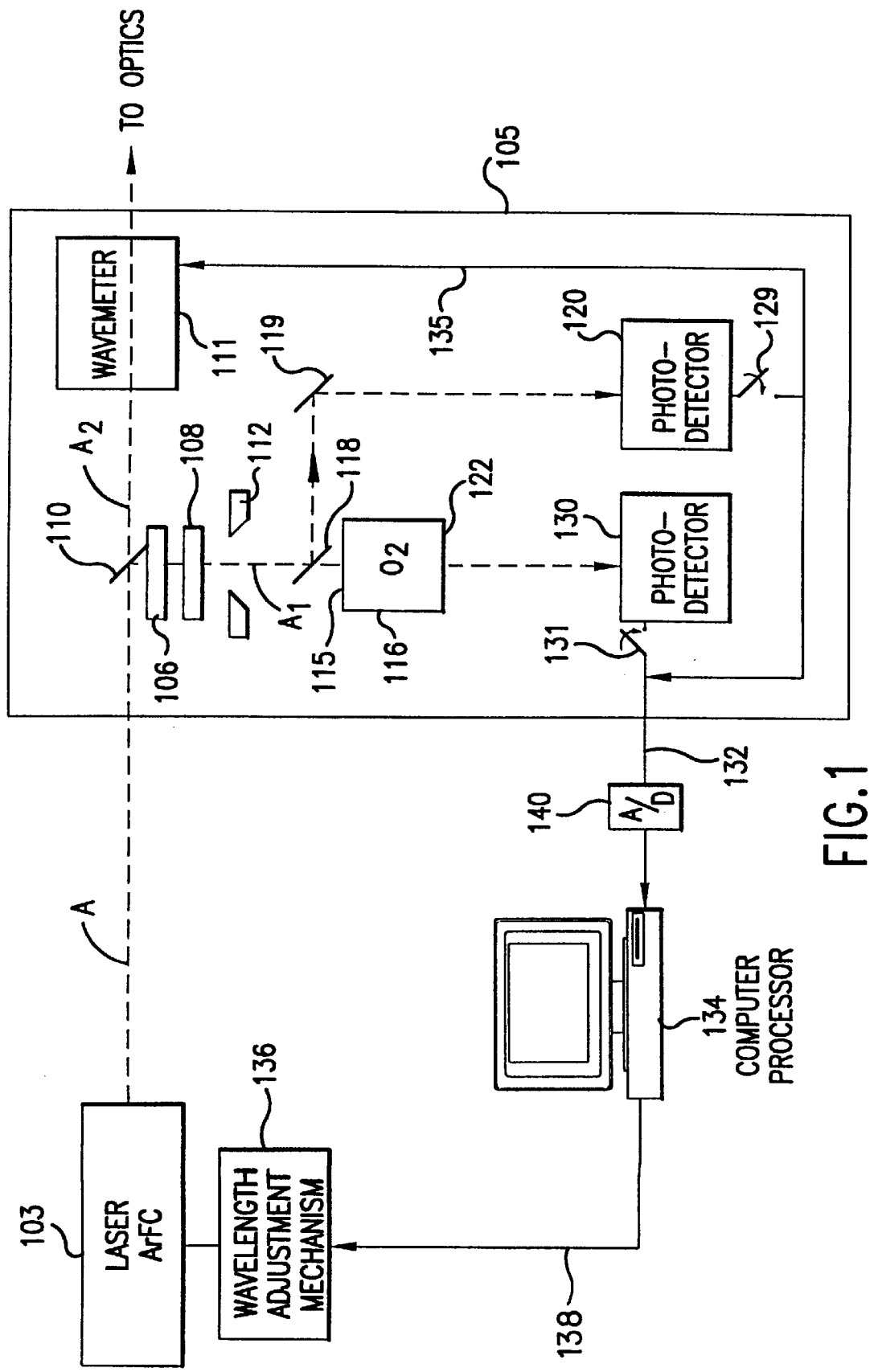
FIG. 1 illustrates the preferred laser tuning system in accordance with one embodiment of the invention.

FIG. 1 is similar to a figure in U.S. Pat. No. 5,450,207 except that the absorption gas has been replaced by one or more other gases that have absorptions at around 193 nm. Other differences exist.

The tunable laser 103 has a tuning range within about 193–194 nm. The preferred laser 103 is an argon fluoride (ArF) excimer laser. This laser is now being used for advanced deep ultra-violet lithography and is incorporated into a stepper/scanner system for semiconductor wafer fabrication. The wavelength of the laser is tuned to a specific wavelength in the spectrum of the ArF laser so as to be optimized for the stepper optics. The structure and method described below is used to accurately measure the wavelength of the laser as it is tuned within its spectrum. This technique minimizes or eliminates drifts that commonly occur in wavelength measuring tools and allows the laser wavelength to be checked frequently for accuracy.

The elements in FIG. 1 which are identical or similar to those elements described in the '207 patent will only be briefly identified, and further detail may be obtained from the '207 patent.

The tunable ArF laser 103 has in the laser excitation chamber small quantities of argon and fluorine gas, which are the active gases, and neon as a buffer gas. A trace amount of carbon, on the order of 10 parts per billion, is also found in the laser excitation chamber. This carbon impurity is caused by trace amounts of oil, air, and other contaminants. As will be described later, this carbon will be used as an absorption gas for calibrating the laser 103.

Laser 103 outputs a laser beam A, which enters a wavelength detection system 105. Preferably system 105 is continuously purged with nitrogen. A beam splitter 110 reflects a portion of the beam energy $A_1$ through a pair of diffusers 106 and 108. Diffusers 106 and 108 operate to average the wavelengths of the beam across the cross-section of the beam to substantially eliminate any slight deviations in the beam wavelengths.

The portion $A_2$ of the beam transmitted through splitter 110 is applied to a wavemeter 111, using suitable optics, and then focused by optics in a stepper for use in a wafer fabrication process. The laser system of FIG. 1 may be used for other applications. Wavemeter 111 will be used to determine wavelengths and may be conventional.

The diffused beam $A_1$ passes through an aperture 112 so that the diffused beam is no larger than a transparent port 115 (such as quartz) of an absorption gas cell 116. In the preferred embodiment, cell 116 contains an amount of oxygen ($O_2$) or air. Gases in addition to oxygen may also reside in cell 116, such as vapors of C, Fe, Co, Ni, or Al. An increased pressure of the gas in cell 116 deepens the absorption lines. Also, extending the length of cell 116 also deepens the absorption lines. Alternatively, cell 116 may be replaced by an air path.

A beam splitter 118 and mirror 119 reflect a portion of the laser beam to a photodetector 120, which will be used for calibration, to be described later.

Almost all of the portion of the laser beam entering cell 116 will exit through a transparent output port 122 and be received by a photodetector 130. The electrical signal output by photodetector 130 corresponds to the light intensity impinging upon photodetector 130. Photodetector 130 should have the same sensitivity to all light within the tunable range of laser 103.

Figure 2:
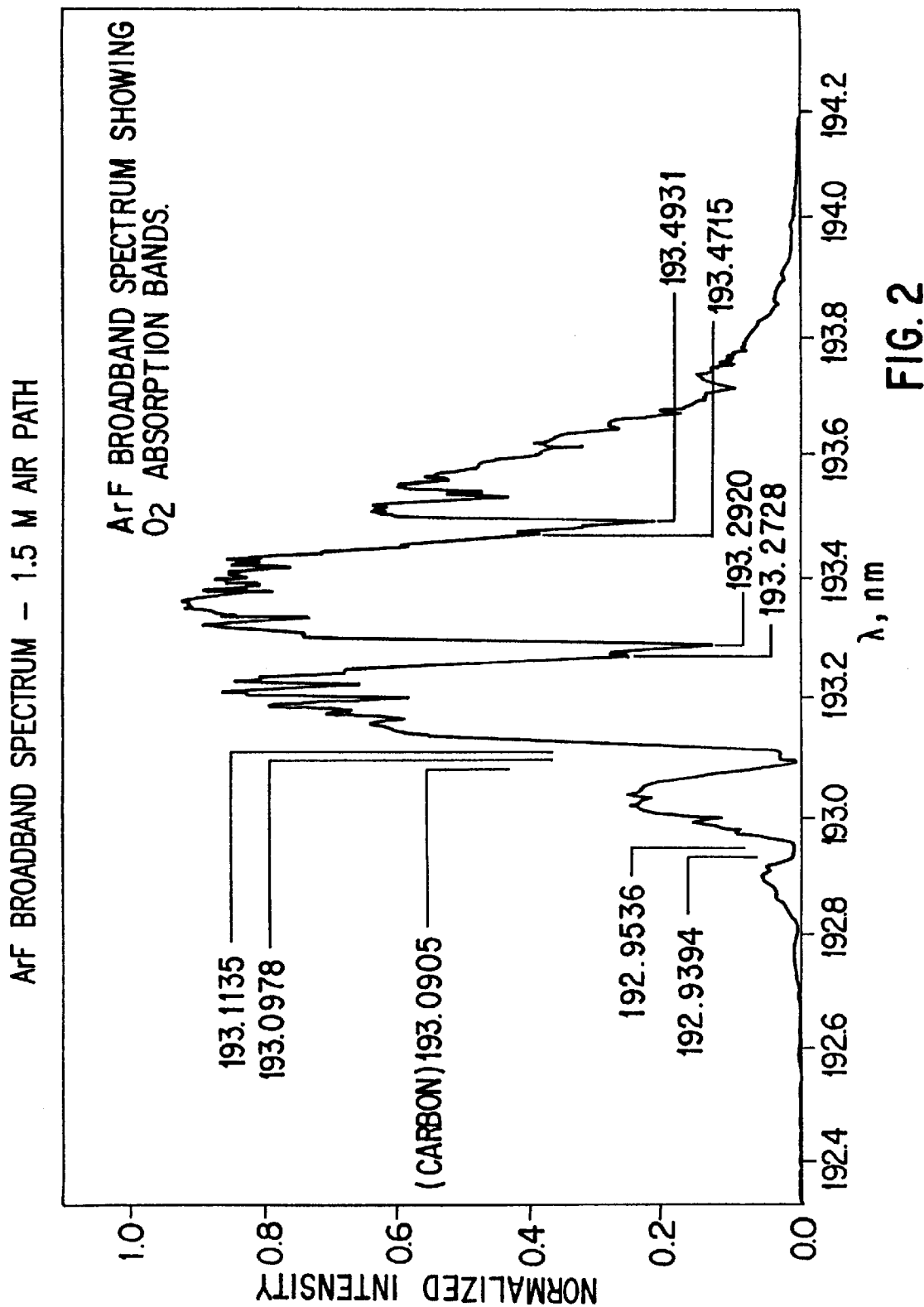
FIG. 2 is a graph of the absorption of light by oxygen within a certain range.

FIG. 2 is a graph of the normalized intensity of the laser light versus wavelength for the tunable range of the laser beam emitted from laser 103, as detected by photodetector 130, after passing through gas cell 116 containing oxygen. FIG. 2 shows dips in the spectrum corresponding to eight of the $O_2$ absorption bands. The low points in the spectrum are well defined and represent those wavelengths of light absorbed by the $O_2$ molecules. These wavelengths are numerically identified along with the 193.0905 nm absorption line of carbon.

The absorption line of carbon may be used to initially calibrate wavemeter 111, and then wavemeter 111 may be further calibrated using the oxygen absorption lines. The following describes a process used for calibrating wavemeter 111 and tuning laser 103.

In a first step, the wavemeter 111 is calibrated using the carbon line. The excitation chamber in laser 103 contains a trace amount of carbon, which has an absorption line of 193.0905 nm. Splitter 118 and mirror 119 direct a portion of the laser light to a photodetector 120 for use in calibrating the system. Switch 129 is closed and switch 131 is open so that processor 134 receives the intensity level signal from photodetector 120.

Processor 134 carries out an algorithm which controls the wavelength adjustment mechanism 136, via cable 138, to slew the wavelength of the output beam of laser 103 through its tunable range while the intensity level output from photodetector 120 is detected by processor 134. Although the preferred process slews the wavelength of the laser beam, other wavelength adjustment techniques may instead be employed. Typically, an A/D converter 140 would be used to convert the photodetector 120 output to a digital value before being processed by processor 134.

Upon receiving a dip in the intensity level corresponding to the characteristics of the carbon absorption line, it is then known that the laser is tuned to a wavelength of 193.0905 nm. Processor 134 then calibrates itself so that it now correlates its control signals with reference to the absorption line of carbon. Wavemeter 111 is also calibrated by processor 134, via cable 135, such that its wavelength reading corresponds to 193.0905 nm when the wavelength adjustment mechanism 136 adjusts the line narrowing module of laser 103 to cause laser 103 to produce a beam centered at the wavelength 193.0905 nm, the carbon dip wavelength. Calibration of wavemeter 111 may be performed by adjusting its calibration constants.

Switch 129 is then opened and switch 131 is closed in order to now tune laser 103 to any of the absorption lines of oxygen (or other gas in cell 116) within the range of approximately 193–194 nm to finely calibrate wavemeter 111 to a wavelength closer to the final wavelength of interest. Photodetector 130 is now connected to processor 134. Assuming that it is desired to tune laser 103 to the absorption line 193.4931 nm, the laser wavelength is tuned upward by suitably controlling the wavelength adjustment mechanism 136 until the absorption line at 193.4931 nm is detected. This preferably is done by adjusting the wavelength output of laser 103 with mechanism 136 until wavemeter 111 reads approximately 193.4931 nm. Then mechanism 136 is used to slew the wavelength output of laser 103 slightly above and below 193.4931 nm until the adjustment which results in a minimum output by photodetector 130 is determined. The wavemeter 111 is again calibrated to force it to read 193.4931 nm at this low point.

Using this technique of first calibrating the system to the carbon absorption line and then tuning the laser to one of the plurality of oxygen (or other gas) absorption lines may be used for any of the oxygen absorption lines shown in FIG. 2.

Other Preferred Embodiments

In another technique, instead of using wavemeter 111 to coarsely tune laser 103 to approximately an absorption line, the known intensity pattern associated with a particular oxygen absorption line can be compared by processor 134 with a detected intensity pattern. When there is a match, the wavelength of the laser light is known. This line is then utilized to calibrate any devices in the same manner as the carbon line was used in the above description of calibration. In another embodiment, the number of absorption lines between the carbon absorption line and the oxygen absorption line of interest are counted in order to identify an oxygen line near the desired operating wavelength for fine calibration.

In another preferred embodiment, two oxygen lines on both sides of the desired operating wavelength are used for fine calibration. Processor 134 slews the laser wavelength to be between two absorption lines of oxygen (or other gas) by using a coarse wavelength adjustment, followed by a fine wavelength adjustment to calibrate the wavemeter 111, followed by using the wavemeter 111 to accurately slew the laser between the two absorption lines. The coarse wavelength adjustment slews the laser wavelength to approximately a particular absorption line. In one embodiment, processor 134 is able to determine the approximate slewing for coarse wavelength adjustment based on the wavelength reading by the wavemeter 111. In another embodiment, the processor 134 counts dips or other characteristics of the light intensity to determine which absorption line the laser 103 has been slewed to.

In still another preferred embodiment, the coarse adjustment of the laser wavelength may be performed by simple programming of processor 134. An adjustment offset to the wavemeter 111 or processor 134 control signals is generated during calibration at various times.

The actual detection of an absorption line, during fine tuning, by monitoring a dip in the light intensity then acts as a second calibration of the wavemeter 111. An additional (third) wavemeter 111 calibration may then be made by also detecting the next absorption line, where the wavelength of interest is between the two calibrating absorption lines.

The laser 103 is then tuned to the desired wavelength between the two absorption lines using the calibrated wavemeter 111. The techniques described above are in general more accurate than prior art methods, since the wavelength calibration of wavemeter 111 using one or two absorption lines of, for example, oxygen occurs relatively close to the wavelength of interest. Thus, very little error is incurred by uncertainties inherent in the wavemeter.

By using the carbon impurities in the laser 103 itself for initially calibrating the system, no additional calibration system, such as that described in the '207 patent, need be employed.

In an alternate embodiment, initial calibration of the system may be performed by tuning laser 103 to a particular absorption line in oxygen, rather than carbon, such as at 193.2920 nm or 193.4931 nm. The determination of a particular absorption line may be made by detecting the intensity level pattern corresponding to that absorption line.

Figure 3:
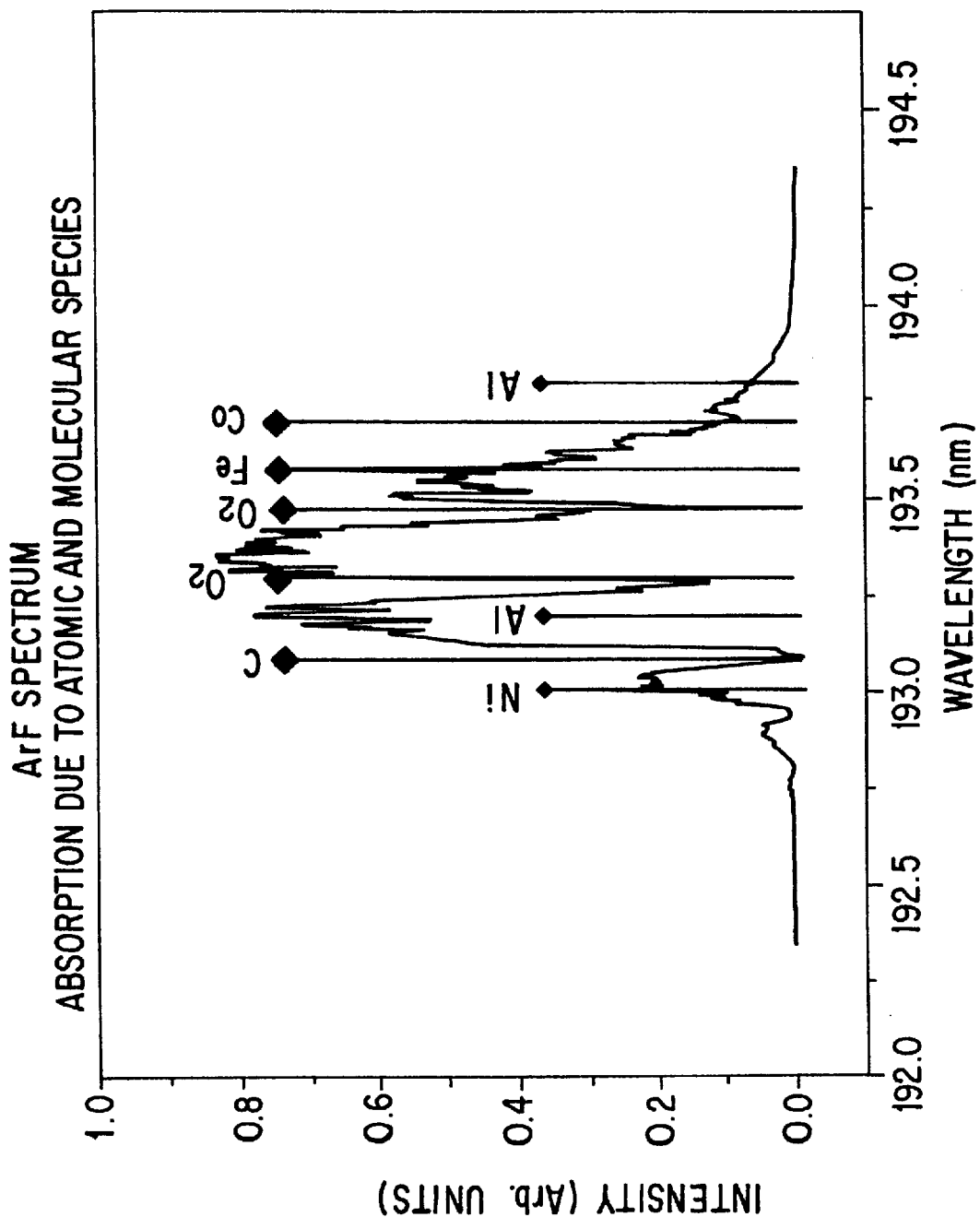
FIG. 3 is a graph of the absorption of light by a variety of gases within a certain range.

FIG. 3 illustrates absorption lines of other gases such as vapors of Fe, Co, Ni, and Al based gases in the range of 193 nm to 194 nm. These gases may be used instead of or in conjunction with oxygen or carbon for calibrating the wavemeter 111 as previously described.

Although a specific structure is shown for detecting oxygen absorption lines other suitable embodiments may be employed. In one alternative embodiment, a single photo-detector is used to measure both the light passing through the cell 116 and light not passing through cell 116. This may be implemented using a different optical setup, as would be understood by those skilled in the art after reviewing this disclosure.

Other Techniques for Tuning the Laser

The laser 103 may also be tuned to a wavelength between two absorption lines using interpolation based on the gas absorption lines. For example, if the desired wavelength were one-half the distance between two absorption lines, the laser would be slewed for one-half the time (or distance) it would take to slew the laser between the two absorption lines. This would obviate the need for wavemeter 111.

Tuning of laser 103 to a desired wavelength may be performed in various well known ways, which may be mechanically, optically, or chemically (by controlling the gas components within laser 103), although tuning the laser optically as described in the background section of this specification is preferred. Any of these known mechanisms for tuning a laser in response to a control signal may constitute the wavelength adjustment mechanism 136 in FIG. 1.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A laser tuning method comprising:

energizing a tunable laser;

passing at least a portion of a laser beam generated by said laser through one or more gases that have a plurality of absorption lines in the tuning range of interest;

adjusting the laser to produce a laser beam covering a first range of wavelengths, wherein said adjusting said laser includes slewing said laser beam through a range of wavelengths covering a plurality of said absorption lines;

detecting an intensity of said laser beam passing through said one or more gases at each of a plurality of wavelengths within said first range of wavelengths;

determining a first wavelength or a first narrow band of wavelengths of said laser beam passing through said one or more gases which corresponds to at least one of said plurality of absorption lines of said one or more gases; and using said determining to tune said laser to a desired wavelength or a desired narrow band of wavelengths.

2. The method of claim 1 wherein said laser has a tunable range of approximately 193–194 nanometers.

3. The method of claim 1 wherein said using comprises calibrating a wavemeter using at least one of said plurality of absorption lines and then using said wavemeter for tuning said laser to a wavelength of interest.

4. The method of claim 1 further comprising:

performing a calibration of a wavemeter by producing a wavelength corresponding to an absorption line of carbon.

5. The method of claim 4 wherein said carbon is located within an excitation chamber of said laser.

6. The method of claim 1 wherein said one or more gasses is selected from the group consisting of oxygen ($O_2$), iron (Fe), cobalt (Co), nickel (Ni), aluminum (Al), and carbon based gases.

7. The method of claim 1 wherein said using comprises calibrating a wavemeter using at least one of said plurality of absorption lines, said method further comprising:

further adjusting the laser to produce laser beams covering a second range of wavelengths;

determining a second wavelength or second narrow band of wavelengths of said laser beam passing through said one or more gasses which corresponds to at least one additional line of said plurality of absorption lines of said one or more gases;

calibrating said wavemeter to said at least one additional line of said plurality of absorption lines; and tuning said laser to a wavelength or narrow band of wavelengths between said first wavelength or said first narrow band of wavelengths and said second wavelength or said second narrow band of wavelengths in order to cause the laser to produce a wavelength of interest as determined by said wavemeter.

8. The method of claim 1 further comprising:

adjusting said laser to produce a range of wavelengths to identify a laser adjustment position corresponding to an absorption line of carbon, prior to said passing; and calibrating a wavemeter based on said absorption line of carbon.

9. The method of claim 1 wherein one of said plurality of absorption lines is an absorption line for carbon.

10. The method of claim 9 further comprising:

performing a calibration of a wavemeter by producing a wavelength corresponding to said absorption line of carbon;

initially calibrating said wavemeter using said absorption line of carbon; and finely calibrating said wavemeter based on another of said plurality of absorption lines.

11. A laser tuning method comprising:

energizing a tunable laser to produce a laser beam, said laser having an excitation chamber containing gaseous carbon;

adjusting said laser by slewing said laser beam through a range of wavelengths covering an absorption line for said carbon;

measuring an intensity of said laser beam;

determining a wavelength or a narrow band of wavelengths of said laser beam corresponding to a particular absorption line of said carbon; and calibrating wavelength measuring equipment based on said determining.

12. The method of claim 11 wherein said laser is an excimer laser with an excitation chamber containing a primary gas other than carbon.

13. A tunable laser system comprising:

a tunable excimer laser for outputting a laser beam;

a gas cell containing one or more gases that have a plurality of absorption lines in a tuning range of interest, at least a portion of said laser beam passing through said gas cell;

a wavelength adjustment mechanism connected to said laser;

a wavemeter configured to receive at least a portion of said laser beam, said wavemeter receiving a calibrating signal, and outputting a signal corresponding to a wavelength of said laser beam; and a processor programmed for detecting a dip in an energy of said laser beam passing through said gas cell to determine a wavelength or a narrow band of wavelengths of said laser beam which matches a wavelength of an absorption line of said one or more gases in said gas cell and for providing said calibrating signal to said wavemeter corresponding to at least one of said absorption lines of said one or more gases.

14. The system of claim 13 wherein said one or more gases includes oxygen.

15. The system of claim 13 wherein said one or more gases are selected from the group consisting of oxygen ($O_2$), iron (Fe), cobalt (Co), nickel (Ni), aluminum (Al) and carbon based gases.

* * * * *